United States Patent
Shimomura

(10) Patent No.: US 11,183,396 B2
(45) Date of Patent: Nov. 23, 2021

(54) SUBSTRATE PROCESSING METHOD AND SUBSTRATE PROCESSING APPARATUS

(71) Applicant: TOKYO ELECTRON LIMITED, Tokyo (JP)

(72) Inventor: Shinichiro Shimomura, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/841,716

(22) Filed: Apr. 7, 2020

(65) Prior Publication Data

US 2020/0335356 A1 Oct. 22, 2020

(30) Foreign Application Priority Data

Apr. 22, 2019 (JP) .............................. JP2019-080689

(51) Int. Cl.
| | |
|---|---|
| *H01L 21/321* | (2006.01) |
| *H01L 21/3213* | (2006.01) |
| *H01L 21/67* | (2006.01) |
| *H01L 21/683* | (2006.01) |

(52) U.S. Cl.
CPC .... *H01L 21/32134* (2013.01); *H01L 21/6708* (2013.01); *H01L 21/67098* (2013.01); *H01L 21/67173* (2013.01); *H01L 21/6838* (2013.01)

(58) Field of Classification Search
None
See application file for complete search history.

(56) References Cited

U.S. PATENT DOCUMENTS

| | | | | |
|---|---|---|---|---|
| 6,683,007 | B1 * | 1/2004 | Yamasaki | ................. B08B 3/02 |
| | | | | 257/E21.219 |
| 2002/0155648 | A1 * | 10/2002 | Ashjaee | ............... H01L 21/2885 |
| | | | | 438/198 |

FOREIGN PATENT DOCUMENTS

JP 2011-066194 3/2011

* cited by examiner

*Primary Examiner* — Roberts P Culbert
(74) *Attorney, Agent, or Firm* — Amin, Turocy & Watson, LLP

(57) ABSTRACT

A substrate processing method according to the present disclosure includes heating and removing. The heating includes heating a substrate with a copper film that is formed thereon. The removing includes removing a copper film that is formed on a peripheral part of the substrate after the heating by supplying a processing liquid that contains an acidic chemical liquid to the peripheral part.

3 Claims, 8 Drawing Sheets

SUBSTRATE PROCESSING METHOD AND SUBSTRATE PROCESSING APPARATUS

CROSS-REFERENCE TO RELATED APPLICATION(S)

The present application claims the benefit of priority to Japanese Patent Application No. 2019-080689 filed on Apr. 22, 2019, the entire contents of which are herein incorporated by reference.

FIELD

The present disclosure relates to a substrate processing method and a substrate processing apparatus.

BACKGROUND

A technique to remove a film that is formed on a substrate such as a semiconductor wafer or a glass substrate by a chemical liquid has been known conventionally. Japanese Patent No. 5184476 discloses a technique to remove a film that is formed on a peripheral part of a substrate by supplying a chemical liquid to the peripheral part of the substrate.

SUMMARY

A substrate processing method according to an aspect of the present disclosure includes a previous heating process and a removing process. The previous heating process heats a substrate with a copper film that is formed thereon. The removing process removes a copper film that is formed on a peripheral part of the substrate after the previous heating process by supplying a processing liquid that contains an acidic chemical liquid to the peripheral part.

DESCRIPTION OF EMBODIMENTS

Hereinafter, a mode for implementing a substrate processing method and a substrate processing apparatus according to the present disclosure (that will be described as "an embodiment" below) will be explained in detail with reference to the drawings. Additionally, a substrate processing method and a substrate processing apparatus according to the present disclosure are not limited by such an embodiment. Furthermore, it is possible to combine respective embodiments appropriately as long as processing contents thereof are not inconsistent. Furthermore, identical components in respective undermentioned embodiments are provided with identical signs and a duplicative explanation thereof will be omitted.

Furthermore, for the sake of clarity of explanation, an orthogonal coordinate system that defines an X-axis direction, a Y-axis direction, and a Z-axis direction that are orthogonal to one another where a Z-axis positive direction is a vertically upward direction may be illustrated in respective drawings that will be referred to below. Furthermore, a direction of rotation where a vertical axis is provided as a center of rotation may be referred to as a θ direction.

First Embodiment

Substrate Processing Apparatus

Figure 1:
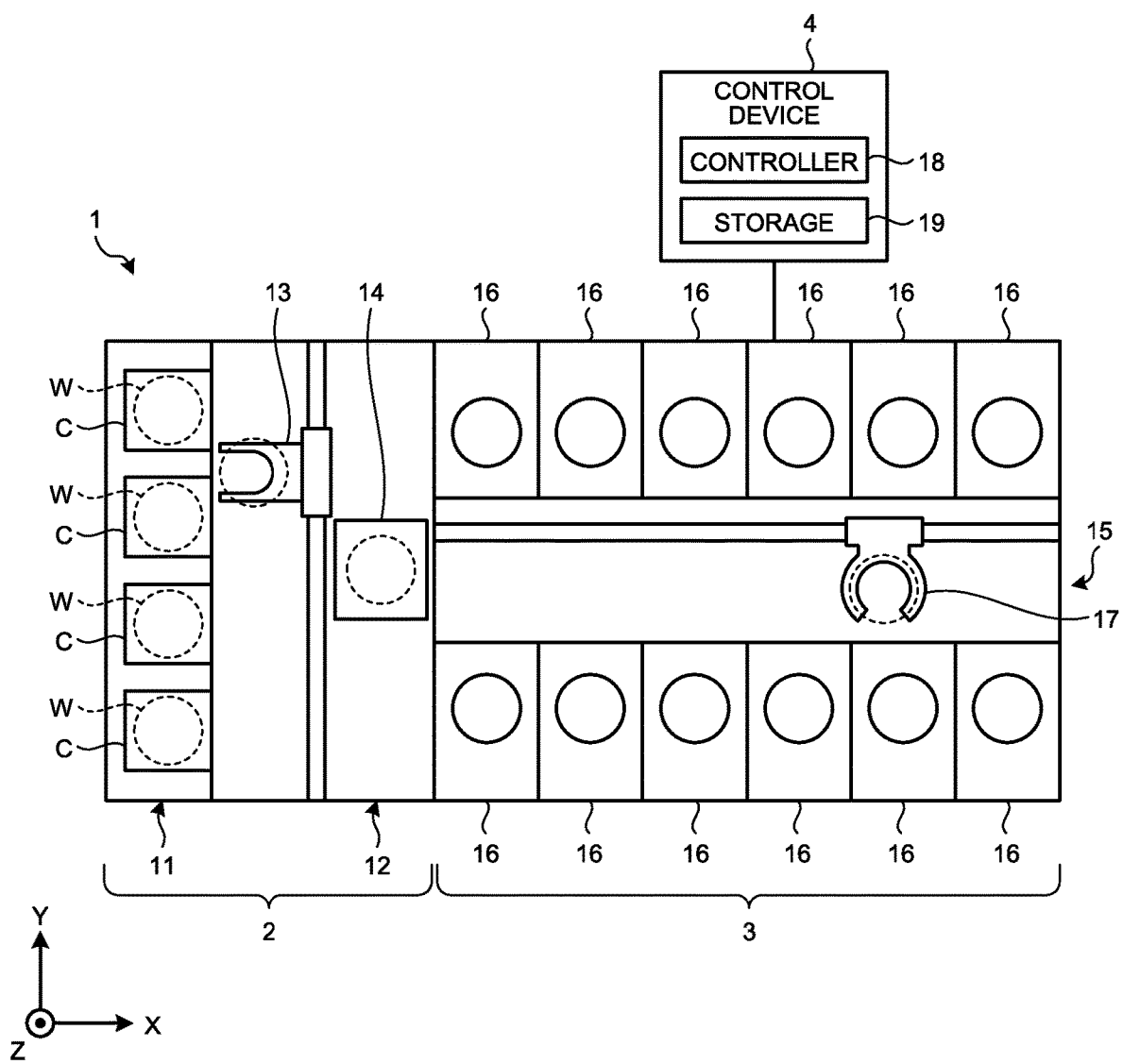
FIG. 1 is a diagram illustrating a configuration of a substrate processing apparatus according to a first embodiment.

FIG. 1 is a diagram illustrating a configuration of a substrate processing apparatus according to a first embodiment. As illustrated in FIG. 1, a substrate processing apparatus 1 includes a carry-in/out station 2 and a processing station 3. The carry-in/out station 2 and the processing station 3 are provided adjacently.

The carry-in/out station 2 includes a carrier placing section 11 and a transfer section 12. A plurality of carriers C that accommodate a plurality of substrates (that will be described as "wafers W" below) in a horizontal state thereof are placed on the carrier placing section 11.

The transfer section 12 is provided so as to be adjacent to the carrier placing section 11 and internally includes a substrate transfer device 13 and a delivery unit 14. The substrate transfer device 13 includes a substrate holding mechanism that holds a wafer W. Furthermore, the substrate transfer device 13 is capable of moving in a horizontal direction and a vertical direction and pivoting around a vertical axis as a center and executes transfer of a wafer W between a carrier C and the delivery unit 14 by using a substrate holding mechanism.

The processing station 3 is provided so as to be adjacent to the transfer section 12. The processing station 3 includes a transfer section 15 and a plurality of processing units 16. The plurality of processing units 16 are provided side by side on both sides of the transfer section 15.

The transfer section 15 internally includes a substrate transfer device 17. The substrate transfer device 17 includes a substrate holding mechanism that holds a wafer W. Furthermore, the substrate transfer device 17 is capable of moving in a horizontal direction and a vertical direction and pivoting around a vertical axis as a center and executes transfer of a wafer W between the delivery unit 14 and a processing unit 16 by using a substrate holding mechanism.

A processing unit 16 executes predetermined substrate processing for a wafer W that is transferred by the substrate transfer device 17.

Furthermore, the substrate processing apparatus 1 includes a control device 4. The control device 4 is, for example, a computer and includes a controller 18 and a storage 19. The storage 19 stores a program that controls a variety of processes that are executed in the substrate processing apparatus 1. The controller 18 reads and executes a program that is stored in the storage 19 so as to control an operation of the substrate processing apparatus 1.

Additionally, such a program may be recorded in a storage medium that is readable by a computer and be installed on a the storage 19 of the control device 4 from such a storage medium. For a storage medium that is readable by a computer, for example, a hard disk (HD), a flexible disk (FD), a compact disc (CD), a magneto optical disk (MO), a memory card, or the like is provided.

In the substrate processing apparatus 1 configured as described above, first, the substrate transfer device 13 of the carry-in/out station 2 takes a wafer W from a carrier C that is placed on the carrier placing section 11 and places the taken wafer W on the delivery unit 14. A wafer W that is placed on the delivery unit 14 is taken from the delivery unit 14 by the substrate transfer device 17 of the processing station 3 and carried in a processing unit 16.

A wafer W that is carried in a processing unit 16 is processed by the processing unit 16, subsequently carried out from the processing unit 16 by the substrate transfer device 17, and placed on the delivery unit 14. Then, a processed wafer W that is placed on the delivery unit 14 is returned to a carrier C of the carrier placing section 11 by the substrate transfer device 13.

Configuration of Processing Unit

Figure 2:
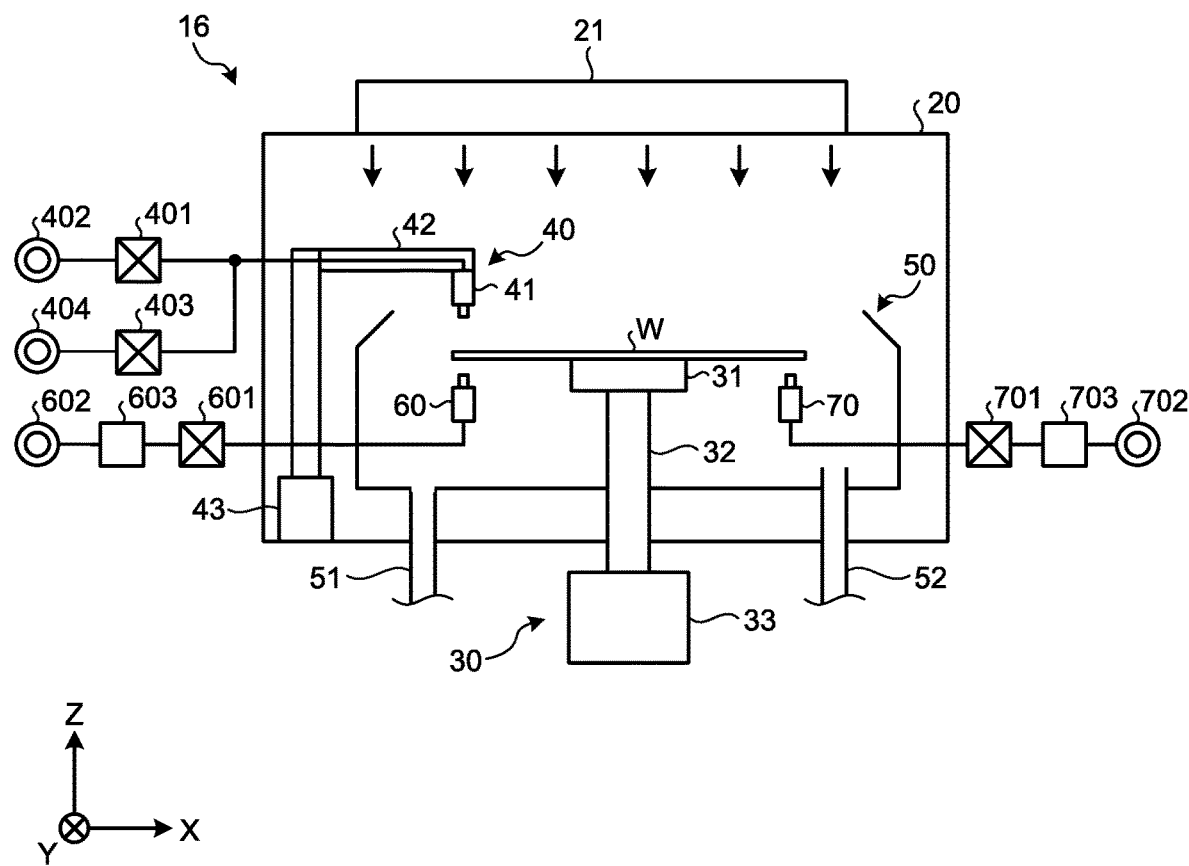
FIG. 2 is a diagram illustrating a configuration of a processing unit according to a first embodiment.

Next, a configuration of a processing unit 16 will be explained with reference to FIG. 2. FIG. 2 is a diagram illustrating a configuration of a processing unit 16 according to the first embodiment.

A processing unit 16 as illustrated in FIG. 2 supplies, to a peripheral part of a wafer W, a dilute SPM provided by diluting a Sulfuric Acid Hydrogen Peroxide Mixture (SPM) that is a mixed solution of sulfuric acid and hydrogen peroxide with water ($H_2O$). A copper film is formed on a surface of a wafer W. A processing unit 16 supplies a dilute SPM to a peripheral part of a wafer W so as to remove a copper film that is formed on the peripheral part of the wafer W. A peripheral part of a wafer W is an annular region with a width of, for example, approximately 1 to 5 mm from an end face of the wafer W.

As illustrated in FIG. 2, a processing unit 16 includes a chamber 20, a substrate holding mechanism 30, a supply unit 40, a recovery cup 50, a heating unit 60, and a temperature regulating unit 70.

The chamber 20 accommodates the substrate holding mechanism 30, the supply unit 40, the recovery cup 50, the heating unit 60, and the temperature regulating unit 70. A Fan Filter Unit (FFU) 21 is provided on a ceiling part of the chamber 20. The FFU 21 forms a downflow in the chamber 20.

The substrate holding mechanism 30 holds a wafer W horizontally and rotatably. The substrate holding mechanism 30 includes a holding unit 31, a pole unit 32, and a driving unit 33.

The holding unit 31 is, for example, a vacuum chuck, and adsorbs and holds a central part of a bottom surface of a wafer W. The pole unit 32 extends in a vertical direction, where a proximal end thereof is rotatably supported by the driving unit 33 and a leading end thereof holds the holding unit 31 horizontally. The driving unit 33 rotates the pole unit 32 around a vertical axis. The substrate holding mechanism 30 rotates the pole unit 32 by using the driving unit 33 so as to rotate the holding unit 31 that is supported by the pole unit 32 and thereby rotate a wafer W that is held by the holding unit 31.

The supply unit 40 supplies a dilute SPM to a peripheral part of a top surface of a wafer W. Specifically, the supply unit 40 includes a nozzle 41 that is arranged above a wafer W, an arm 42 that supports the nozzle 41, and a movement mechanism 43 that moves the arm 42.

The nozzle 41 is connected to a dilute SPM supply source 402 via a valve 401. The dilute SPM supply source 402 includes, for example, a sulfuric acid supply system, a hydrogen peroxide supply system, a water supply system, and a mixing unit. Such a dilute SPM supply source 402 mixes sulfuric acid that is supplied from a sulfuric acid supply system, hydrogen peroxide that is supplied from a hydrogen peroxide supply system, and water (a deionized water) that is supplied from a water supply system, at a preset mixing ratio, in a mixing unit. Thereby, the dilute SPM supply source 402 generates, and supplies to the nozzle 41, a dilute SPM.

Furthermore, the nozzle 41 is connected to a rising liquid supply source 404 via a valve 403. The rinsing liquid supply source 404 supplies, for example, a deionized water (DIW) as a rinsing liquid to the nozzle 41.

The recovery cup 50 is arranged so as to surround the holding unit 31 and traps an SPM that is scattered from a wafer W by rotation of the holding unit 31. A liquid drainage port 51 is formed on a bottom part of the recovery cup 50, so that a processing liquid that is trapped by the recovery cup 50 is discharged from such a liquid drainage port 51 to an outside of a processing unit 16. Furthermore, a gas drainage port 52 that discharges a gas that is supplied from the FFU 21 to an outside of a processing unit 16 is formed on a bottom part of the recovery cup 50.

The heating unit 60 heats a peripheral part of a wafer W. The heating unit 60 in the first embodiment has a nozzle that is arranged below a wafer W, so that a heated fluid is supplied from such a nozzle to a peripheral part of a bottom surface of the wafer W so as to heat the peripheral part of the wafer W.

The heating unit 60 is connected to a fluid supply source 602 via a valve 601. The fluid supply source 602 supplies, for example, an inert gas such as nitrogen. Furthermore, a heating mechanism 603 is provided between the valve 601 and the fluid supply source 602, so that an inert gas that is supplied from the fluid supply source 602 is heated at a preset temperature by the heating mechanism 603 and supplied to the heating unit 60. Additionally, a fluid that is suppled from the heating unit 60 is not limited to an inert gas and may be an air such as dry air or another gas.

The temperature regulating unit 70 regulates a temperature of a peripheral part of a wafer W that is heated by the heating unit 60 so as to be a processing temperature in a process that uses a dilute SPM (a periphery removing process as described later). The temperature regulating unit 70 in the first embodiment has a nozzle that is arranged below a wafer W. The temperature regulating unit 70 supplies a gas (that will be described as a "cooling gas" below) at a temperature that is lower than that of a gas (that will be described as a "hot gas" below) that is supplied from the heating unit 60 from such a nozzle to a peripheral part of a bottom surface of a wafer W.

The temperature regulating unit 70 is connected to a fluid supply source 702 via a valve 701. The fluid supply source 702 supplies, for example, an inert gas such as nitrogen. Furthermore, a temperature regulating mechanism 703 is provided between the valve 701 and the fluid supply source 702, so that an inert gas that is supplied from the fluid supply source 702 is regulated so as to be at a preset temperature by the temperature regulating mechanism 703 and supplied to the temperature regulating unit 70. Additionally, a fluid that is suppled from the temperature regulating unit 70 is not limited to an inert gas and may be an air such as dry air or another gas.

An example of a case where the heating unit 60 and the temperature regulating unit 70 include respective nozzles and a hot gas and a cooling gas are supplied from separate nozzles is illustrated herein. This is not limiting, so that the heating unit 60 and the temperature regulating unit 70 may include a single nozzle and a hot gas and a cooling gas may be supplied from such a single nozzle.

Regarding Generation of Corrosion on Periphery of Removal Interface

Figure 3:
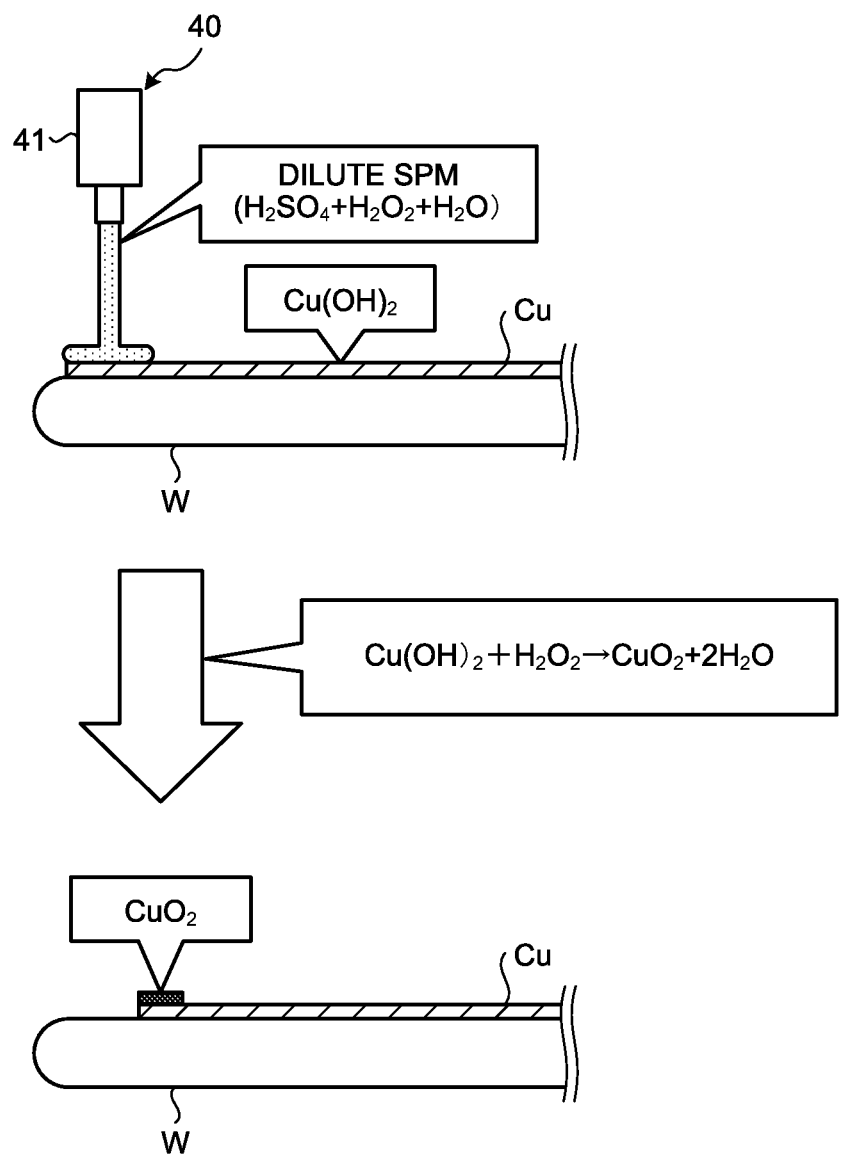
FIG. 3 is a diagram illustrating an example of a generation mechanism of corrosion on a periphery of a removal interface.

Meanwhile, as a copper film on a peripheral part of a substrate is removed by using a dilute SPM, a copper film on a periphery of a removal interface may be corroded. The inventor(s) of the present application found that a cause of corrosion lies in copper hydroxide that is present on a copper film, as a result(s) of an active study thereof. This matter will be explained with reference to FIG. 3. FIG. 3 is a diagram illustrating an example of a generation mechanism of corrosion on a periphery of a removal interface.

As illustrated in FIG. 3, copper hydroxide ($Cu(OH)_2$) may be present on a surface of a copper film. This is because, for example, in a process where a copper film is formed on a wafer W, such as a plating process, as a rinsing process is executed with a DIW after the copper film is formed, copper in the copper film and water react so as to be changed to copper hydroxide.

As a dilute SPM is supplied to a copper film with copper hydroxide that is present on a surface thereof, hydrogen peroxide that is contained in the dilute SPM reacts with the copper hydroxide so as to generate copper peroxide ($CuO_2$) on the copper film. Although a dilute SPM is supplied to a copper film on a peripheral part of a wafer W and the copper film on the peripheral part of the wafer W is removed by the dilute SPM, the dilute SPM is also attached to a copper film on a periphery of a removal interface, so that copper peroxide ($CuO_2$) is generated on the periphery of the removal interface so as to cause corrosion thereof.

Although a dilute SPM is provided as an example herein, it is also possible for another processing liquid that contains hydrogen peroxide to cause a similar phenomenon. Specifically, such a processing liquid contains an acidic chemical liquid and hydrogen peroxide, where, for example, an SPM, an FPM, an SC2, or the like, other than a dilute SPM as described above, is provided. An FPM is a mixed solution of a hydrofluoric acid (HF) and hydrogen peroxide and an SC2 is a mixed solution of a hydrochloric acid (HCl) and hydrogen peroxide.

On the other hand, it is known that copper hydroxide is comparatively unstable against heat as a characteristic thereof, so that heating at a temperature of 60° C. or higher causes dehydration and decomposition thereof so as to be changed to copper oxide (II) (CuO).

Hence, in the substrate processing apparatus 1 according to the first embodiment, a wafer W is heated so as to remove copper hydroxide on a copper film before a periphery removing process that uses a dilute SPM is executed, so that generation of corrosion on a removal interface is prevented.

Specific Operation of Processing Unit

Figure 4:
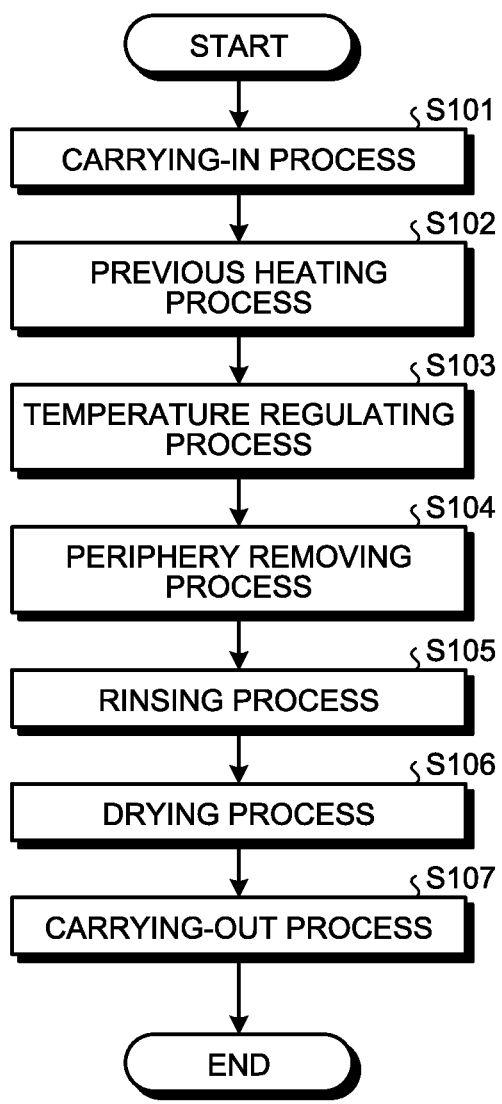
FIG. 4 is a flowchart illustrating steps of substrate processing that is executed by a processing unit according to a first embodiment.

Next, a content of substrate processing that is executed by a processing unit 16 according to the present embodiment will be explained with reference to FIG. 4. FIG. 4 is a flowchart illustrating steps of substrate processing that is executed by a processing unit 16 according to the first embodiment. Each processing step as illustrated in FIG. 4 is executed according to control of the controller 18.

First, a carrying-in process for a wafer W is executed in a processing unit 16 (step S101). Specifically, a wafer W is carried in the chamber 20 (see FIG. 2) of a processing unit 16 by the substrate transfer device 17 (see FIG. 1) and held by the holding unit 31. Subsequently, a processing unit 16 rotates the holding unit 31 at a predetermined rotational speed (for example, 50 rpm).

Figure 5:
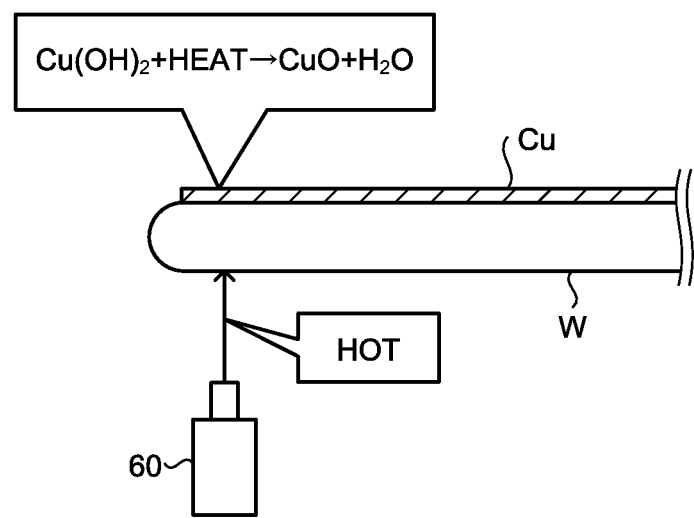
FIG. 5 is a diagram illustrating an operation example of a previous heating process.

Then, a previous heating process is executed in a processing unit 16 (step S102). FIG. 5 is a diagram illustrating an operation example of a previous heating process.

As illustrated in FIG. 5, in a previous heating process, a processing unit 16 supplies a hog gas from the heating unit 60 to a peripheral part of a bottom surface of a wafer W, so that a region that includes a peripheral part of the wafer W is heated.

As a region that includes a peripheral part of a wafer W is heated, copper hydroxide that is formed on a copper film in such a region is decomposed so as to be changed to copper oxide (II). Thereby, copper hydroxide is removed from a copper film in a region that includes a peripheral part of a wafer W.

A processing condition of a previous heating process is set at a condition that is needed to thermally decompose copper hydroxide that is formed on a copper film in a region that includes a peripheral part of a wafer W. For example, a heating temperature for a wafer W in a previous heating process is preferably set at a temperature that is 60° C. or higher and 100° C. or lower. This is because, while it is possible for heating at 60° C. or higher to change copper hydroxide to copper oxide (II), a copper film is hardened if a heating temperature is excessively high.

Additionally, although an example of a case where the heating unit 60 supplies a hog gas to a peripheral part of a bottom surface of a wafer W is illustrated herein, it is sufficient for the heating unit 60 to supply a hog gas to at least a region that includes a peripheral part of a wafer W in a bottom surface of the wafer W. Furthermore, supply of a hot gas to a peripheral part of a wafer W may be indirect. For example, the heating unit 60 may supply a hot gas to a region inside a peripheral part of a bottom surface of a wafer W in a radial direction thereof. In such a case, a hot gas moves outward in a radial direction along a bottom surface of a wafer W and reaches a peripheral part of the bottom surface of the wafer W, so that it is possible to heat the peripheral part of the wafer W.

Figure 6:
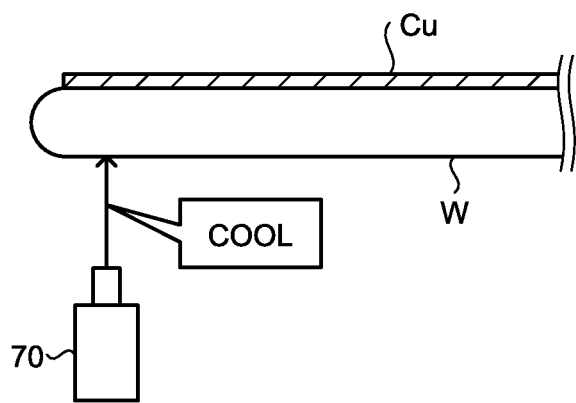
FIG. 6 is a diagram illustrating an operation example of a temperature regulating process.

Then, a temperature regulating process is executed in a processing unit 16 (step S103). FIG. 6 is a diagram illustrating an operation example of a temperature regulating process.

As illustrated in FIG. 6, in a temperature regulating process, a processing unit 16 supplies a cooling gas from the temperature regulating unit 70 to a peripheral part of a bottom surface of a wafer W, so that a temperature of a peripheral part of the wafer W is regulated so as to be a processing temperature for a periphery removing process at a later stage. Specifically, a periphery removing process is executed at an ordinary temperature (for example, 25° C.). Hence, in a temperature regulating process, a processing unit 16 lowers a temperature of a peripheral part of a wafer W to an ordinary temperature by using the temperature regulating unit 70.

A temperature regulating process is thus executed, so that, for example, it is possible to prevent an etching rate for a copper film by a dilute SPM in a periphery removing process at a later stage from being higher than a desired rate. That is, a temperature regulating process is executed, so that it is possible to execute a periphery removing process at a later stage appropriately.

Figure 7:
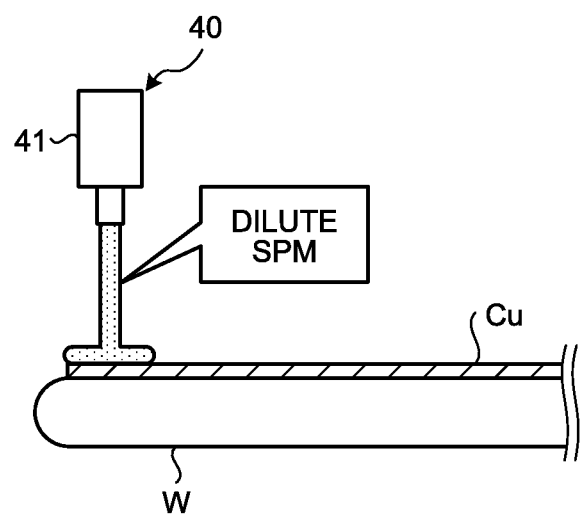
FIG. 7 is a diagram illustrating an operation example of a periphery removing process.
Figure 8:
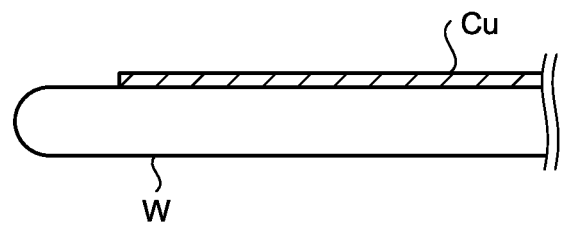
FIG. 8 is a diagram illustrating an operation example of a periphery removing process.

Then, a periphery removing process is executed in a processing unit 16 (step S104). FIG. 7 and FIG. 8 are diagrams illustrating an operation example of a periphery removing process. As illustrated in FIG. 7, a processing unit 16 moves the nozzle 41 above a peripheral part of a top surface of a wafer W by using the movement mechanism 43, and subsequently, supplies a dilute SPM from the nozzle 41 to the peripheral part of the top surface of the wafer W. Thereby, as illustrated in FIG. 8, a copper film is removed from a peripheral part of a top surface of a wafer W.

In a processing unit 16, copper hydroxide on a copper film is removed by a previous heating process. Hence, even though a dilute SPM is supplied to a peripheral part of a top surface of a wafer W in a periphery removing process, copper peroxide is not generated on a periphery of a removal interface of a copper film. Therefore, it is possible to prevent generation of corrosion on a periphery of a removal interface.

As a periphery removing process at step S104 is ended, a rinsing process is executed in a processing unit 16 (step S105). In such a rinsing process, a DIW as a rinsing liquid is supplied from the nozzle 41 to a peripheral part of a top surface of a wafer W. A DIW that is supplied and applied to a wafer W is spread on a whole surface of a peripheral part of a top surface of the wafer W by a centrifugal force that is involved with rotation of the wafer W. Thereby, a dilute SPM that remains on a peripheral part of a top surface of a wafer W is rinsed with a DIW.

Then, a drying process is executed in a processing unit 16 (step S106). In such a drying process, a wafer W is rotated at a predetermined rotational speed (for example, 1000 rpm) for a predetermined period of time. Thereby, a DIW that remains on a wafer W is released therefrom, so that the wafer W is dried. Subsequently, rotation of a wafer W is stopped.

Then, a carrying-out process is executed in a processing unit 16 (step S107). In a carrying-out process, a wafer W that is held by the holding unit 31 is transferred to the substrate transfer device 17. As such a carrying-out process is completed, substrate processing for one wafer W is completed.

Second Embodiment

Figure 9:
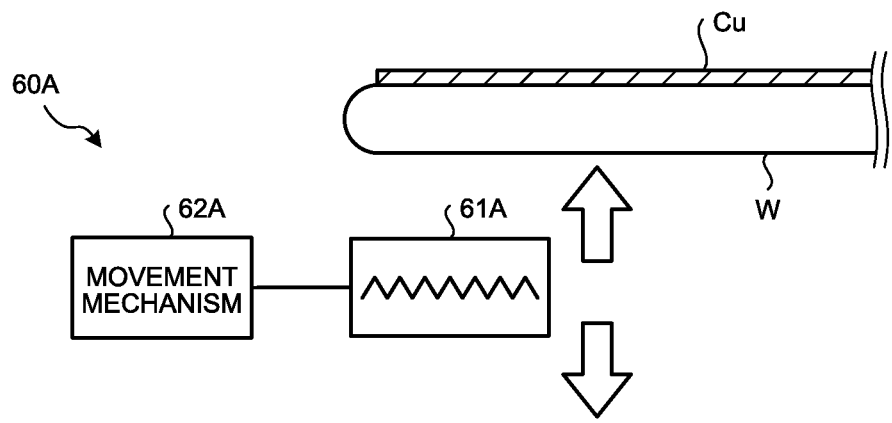
FIG. 9 is a diagram illustrating a configuration of a heating unit according to a second embodiment.

Next, a configuration of a heating unit according to a second embodiment will be explained with reference to FIG. 9. FIG. 9 is a diagram illustrating a configuration of a heating unit according to the second embodiment.

As illustrated in FIG. 9, a heating unit 60A according to the second embodiment includes a heating element 61A and a movement mechanism 62A. The heating element 61A is, for example, a heater that generates heat by an electrical resistor, such as a sheathed heater, and is arranged below a peripheral part of a wafer W. The movement mechanism 62A moves up and down the heating element 61A.

In a previous heating process, the heating unit 60A moves up the heating element 61A by using the movement mechanism 62A, so that the heating element 61A is moved close to a peripheral part of a bottom surface of a wafer W. Then, the heating unit 60A executes electrical conduction on the heating element 61A, so that the heating element 61A generates heat. Thereby, a peripheral part of a bottom surface of a wafer W is heated by heat that is generated from the heating element 61A.

Furthermore, in a temperature regulating process, the heating unit 60A stops electrical conduction on the heating element 61A and subsequently moves down the heating element 61A by using the movement mechanism 62A, so that the heating element 61A is moved away from a peripheral part of a bottom surface of a wafer W. It takes time to cause the heating element 61A, per se, to be cooled after electrical conduction on the heating element 61A is stopped. Hence, if the heating element 61A remains close to a peripheral part of a bottom surface of a wafer W, it is difficult to quickly lower a temperature of a peripheral part of the wafer W to a processing temperature in a periphery removing process, that is, an ordinary temperature.

On the other hand, the heating unit 60A according to the second embodiment moves the heating element 61A away from a peripheral part of a bottom surface of a wafer W by using the movement mechanism 62A, so that it is possible to quickly lower a temperature of a peripheral part of the wafer W to an ordinary temperature.

Additionally, although an example of a case where the movement mechanism 62A moves up and down the heating element 61A is illustrated herein, it is sufficient that it is possible for the movement mechanism 62A to move the heating element 61A close to and away from a peripheral part of a bottom surface of a wafer W, and a direction to move the heating element 61A is not limited to a vertical direction. For example, the movement mechanism 62A may move the heating element 61A horizontally so as to move the heating element 61A close to and away from a peripheral part of a bottom surface of a wafer W.

Third Embodiment

Figure 10:
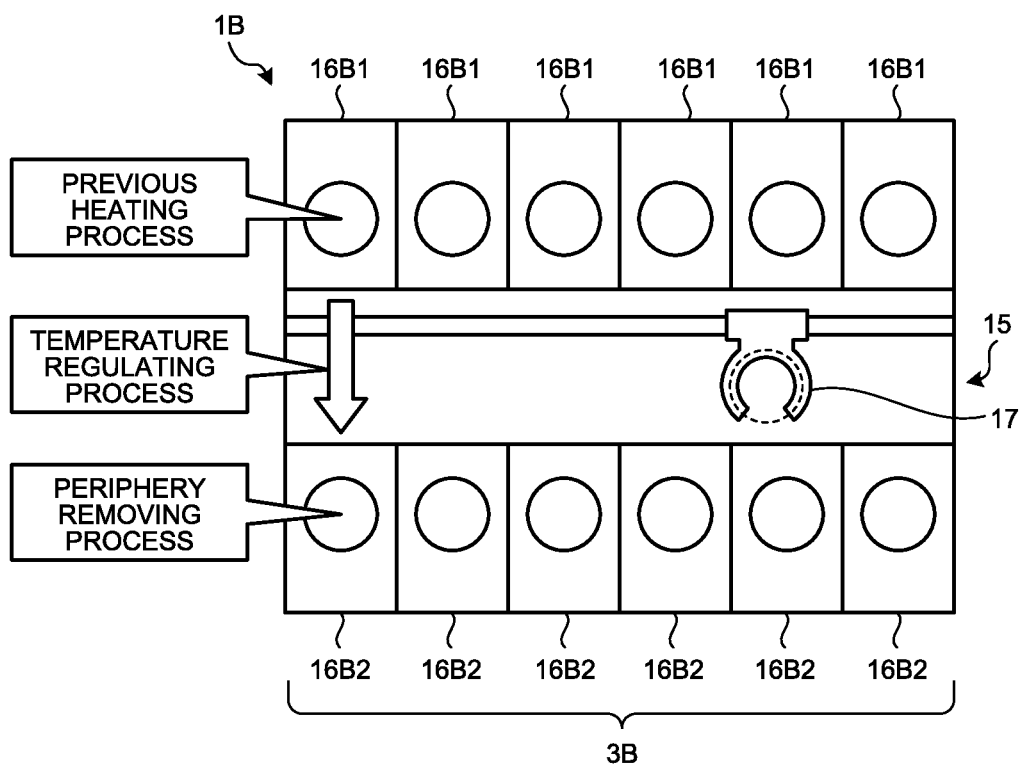
FIG. 10 is a diagram illustrating a configuration of a substrate processing apparatus according to a third embodiment.

Next, a configuration of a substrate processing apparatus according to a third embodiment will be explained with reference to FIG. 10. FIG. 10 is a diagram illustrating a configuration of a substrate processing apparatus according to the third embodiment.

As illustrated in FIG. 10, a substrate processing apparatus 1B according to the third embodiment includes a plurality of heating units 16B1 and a plurality of processing units 16B2 in a processing station 3B.

The plurality of heating units 16B1 include, for example, a hot plate. A hot plate internally includes a heating unit. Furthermore, support pins for supporting a wafer W are provided on a top surface of a hot plate. The plurality of processing units 16B2 have, for example, a configuration where the heating unit 60 and the temperature regulating unit 70 are omitted from the processing unit 16 according to the first embodiment.

In the substrate processing apparatus 1B according to the third embodiment, first, a previous heating process is executed in a heating unit 16B1. Specifically, a wafer W is transferred to a heating unit 16B1 by the substrate transfer device 17 and placed on support pins that are provided on a top surface of a hot plate. Then, a heating unit 16B1 heats a hot plate by using a heating unit that is provided inside the hot plate, so that a wafer W that is placed on the hot plate is heated. Thereby, copper hydroxide on a copper film is decomposed and removed.

Then, in the substrate processing apparatus 1B, a temperature regulating process is executed while a wafer W is transferred from a heating unit 16B1 to a processing unit 16B2 by the substrate transfer device 17. Specifically, the substrate transfer device 17 takes from a heating unit 16B1, and transfers to a processing unit 16B2, a heated wafer W. Herein, it is possible to cool a wafer W that is heated in a previous heating process to an ordinary temperature that is a processing temperature in a periphery removing process.

Additionally, the substrate transfer device 17 may include a temperature regulating unit in a substrate holding mechanism that holds a wafer W. Thereby, it is possible to regulate a temperature of a wafer W so as to be an ordinary temperature more reliably.

Subsequently, in the substrate processing apparatus 1B, a periphery removing process, a rinsing process, and a drying process are executed in a processing unit 16B2.

Thus, the substrate processing apparatus 1B may execute a previous heating process and a periphery removing process in separate units.

Figure 11:
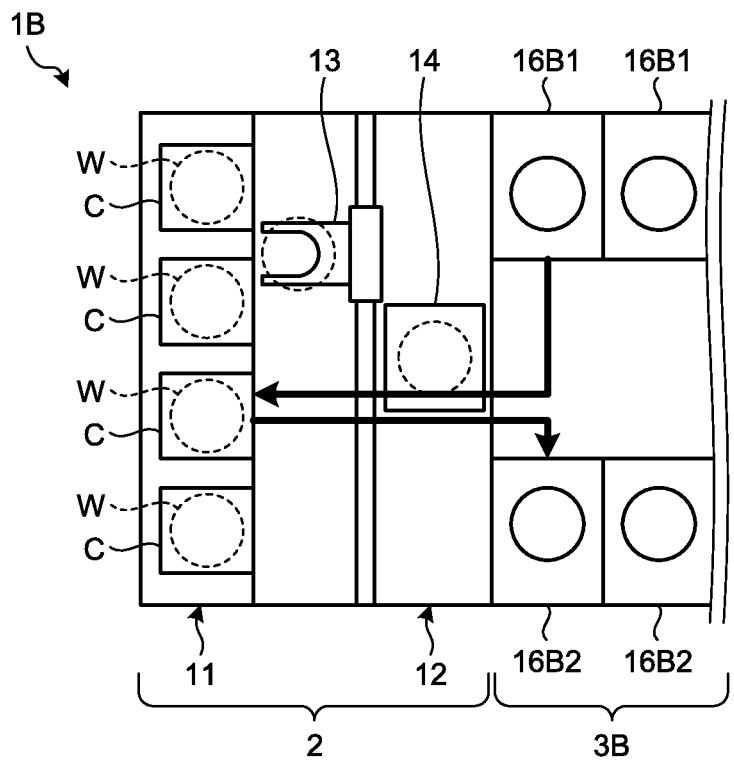
FIG. 11 is a diagram illustrating a variation of a temperature regulating process in a third embodiment.

FIG. 11 is a diagram illustrating a variation of a temperature regulating process in the third embodiment. As illustrated in FIG. 11, a temperature regulating process in the third embodiment may be a process to once accommodate a wafer W that is heated by a heating unit 16B1 in a carrier C. In such a case, it is sufficient to transfer a wafer W from a carrier C to a processing unit 16B2 by using the substrate transfer devices 13, 17 before a periphery removing process is executed.

Thus, a wafer W after a previous heating process is once returned to a carrier C, so that it is possible to ensure a cooling time for the wafer W. Additionally, it is sufficient that an accommodation destination for a wafer W after a previous heating process is a place where it is possible to place the wafer W after the previous heating process temporarily, so that it is not limited to a carrier C. For example, a wafer W after a previous heating process may be accommodated in a non-illustrated temporary placing unit that is arranged above or below the delivery unit 14.

Fourth Embodiment

Figure 12:
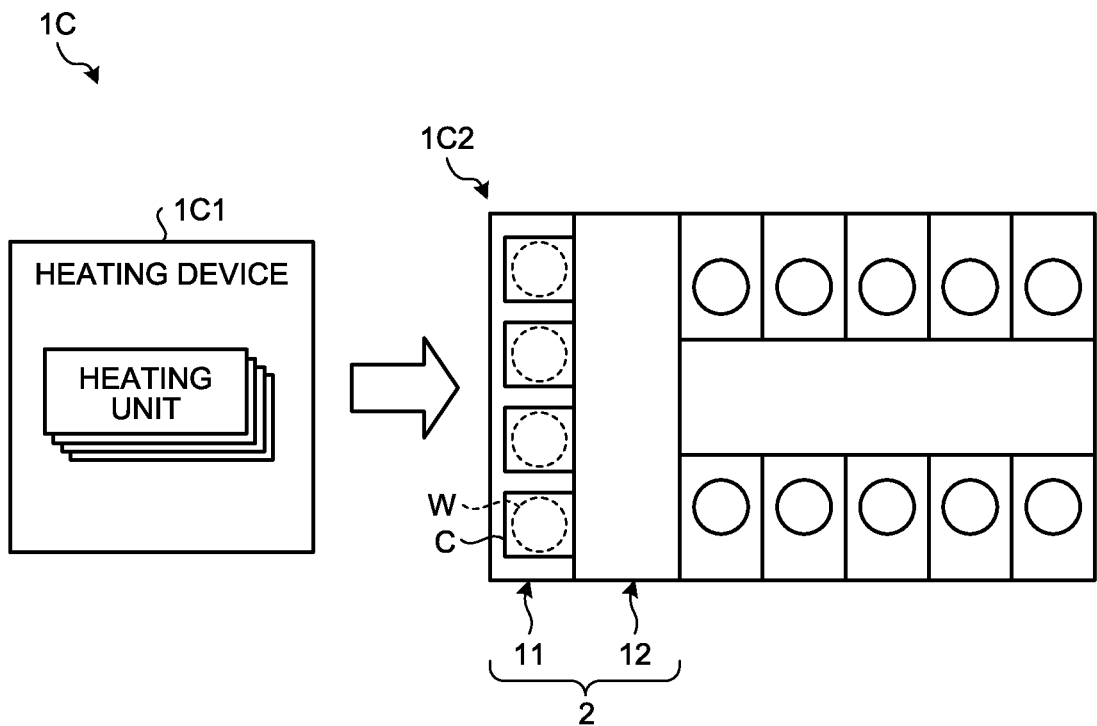
FIG. 12 is a diagram illustrating a configuration of a substrate processing apparatus according to a fourth embodiment.

Next, a configuration of a substrate processing apparatus according to a fourth embodiment will be explained with reference to FIG. 12. FIG. 12 is a diagram illustrating a configuration of a substrate processing apparatus according to the fourth embodiment.

As illustrated in FIG. 12, a substrate processing apparatus 1C according to the fourth embodiment includes a heating device 1C1 and a periphery removing device 1C2. The periphery removing device 1C2 has, for example, a configuration where the heating unit 60 and the temperature regulating unit 70 are omitted from the substrate processing apparatus 1 according to the first embodiment. Furthermore, the heating device 1C1 includes, for example, the plurality of heating units 16B1 according to the third embodiment.

In the fourth embodiment, a wafer W is first transferred to the heating device 1C1 in a state where it is accommodated in a carrier C, taken from the carrier C in the heating device 1C1, and transferred to a heating unit. In a heating unit, a previous heating process is executed for a wafer W. Thereby, copper hydroxide is removed from a copper film on a wafer W. A wafer W after a previous heating process is accommodated in a carrier C again and carried out from the heating device 1C1.

A carrier C that accommodates a wafer W after a previous heating process is placed on the carrier placing section 11 of the periphery removing device 1C2. Subsequently, in the periphery removing device 1C2, a wafer W after a previous heating process is taken from a carrier C and a periphery removing process is executed for the taken wafer W after the previous heating process. Thereby, a copper film is removed from a peripheral part of a top surface of a wafer W.

Thus, the substrate processing apparatus 1C may include the heating device 1C1 that executes a previous heating process outside the periphery removing device 1C2 that executes a periphery removing process. Thus configuration does not have to provide a unit dedicated to a previous heating process (heating unit) to the periphery removing device IC2.

As described above, a substrate processing method according to an embodiment includes a previous heating process (a previous heating process as an example) and a removing process (a periphery removing process as an example). A previous heating process heats a substrate (a wafer W as an example) with a copper film that is formed thereon. A removing process removes a copper film that is formed on a peripheral part of a substrate after a previous heating process by supplying a processing liquid (a dilute SPM as an example) that contains an acidic chemical liquid to the peripheral part.

A substrate is heated in a previous heating process, so that it is possible to thermally decompose, and remove from a copper film, copper hydroxide that is present on the copper film. Thereby, it is possible to prevent corrosion from being generated on a periphery of a removal interface.

A processing liquid further contains hydrogen peroxide. Copper hydroxide reacts with hydrogen peroxide so as to be changed to copper peroxide. Copper hydroxide is removed in a previous heating process, so that a reaction as described above is prevented and generation of corrosion on a periphery of a removal interface is prevented.

A processing liquid is an SPM where sulfuric acid that is an acidic chemical liquid and hydrogen peroxide are mixed, an FPM where hydrofluoric acid that is an acidic chemical liquid and hydrogen peroxide are mixed, or an SC2 where hydrochloric acid that is an acidic chemical liquid and hydrogen peroxide are mixed. Such a processing liquid is used, so that it is possible to remove a copper film from a peripheral part of a substrate in a removing process appropriately.

A previous heating process changes copper hydroxide that is included in a copper film to copper oxide by heating a substrate. Thereby, it is possible to prevent copper hydroxide and hydrogen peroxide from reacting so as to generate copper peroxide in a case where a processing liquid that contains hydrogen peroxide is supplied to a peripheral part of a substrate.

A substrate processing method according to an embodiment may further include a temperature regulating process (a temperature regulating process as an example) that regulates a temperature of a substrate so as to be a processing temperature in a removing process after a previous heating process and before the removing process. Thereby, it is possible to execute a removing process at a later stage appropriately.

A processing temperature is a temperature (for example, an ordinary temperature) that is lower than a heating temperature for a substrate in a previous heating process. Therefore, a temperature regulating process is executed, so that it is possible to prevent an etching rate for a copper film by a processing liquid in a removing process from being higher than a desired rate.

Furthermore, a substrate processing apparatus (the substrate processing apparatus 1, 1B, 1C as an example) according to an embodiment includes a heating unit (the heating unit 60, the heating element 61A, the heating unit 16B1, or the heating device 1C1 as an example), a supply unit (the supply unit 40 as an example), and a temperature regulating unit (the temperature regulating unit 70, the movement mechanism 62A, or the substrate transfer device 17 as an example). A heating unit heats a substrate (a wafer W as an example) with a copper film that is formed thereon. A supply unit supplies a processing liquid (a dilute SPM as an example) that contains an acidic chemical liquid to a peripheral part of a substrate. A temperature regulating unit regulates a temperature of a substrate that is heated by a heating unit so as to be a processing temperature (an ordinary temperature as an example) in a removing process where a processing liquid is supplied from a supply unit to a peripheral part so as to remove a copper film that is formed on the peripheral part.

A substrate is heated by using a heating unit, so that it is possible to thermally decompose, and remove from a copper film, copper hydroxide that is present on the copper film. Thereby, it is possible to prevent corrosion from being generated on a periphery of a removal interface. Furthermore, a temperature of a substrate is regulated so as to be a processing temperature by using a temperature regulating unit, so that it is possible to execute a process to remove a copper film from a peripheral part of a substrate appropriately.

According to an embodiment, it is possible to prevent generation of corrosion on a periphery of a removal interface in a technique to remove a copper film from a peripheral part of a substrate with a copper film that is formed thereon.

It should be considered that embodiments as disclosed herein are not limitative but are illustrative in any aspect. Indeed, the embodiments as described above can be embodied in a variety of forms. Furthermore, the embodiments as described above may be omitted, substituted, or changed in various forms without departing from the appended claims and the spirit thereof.

What is claimed is:

1. A substrate processing method, comprising:
   heating a substrate with a copper film that is formed thereon; and
   removing a copper film that is formed on a peripheral part of the substrate after the heating by supplying a processing liquid that contains an acidic chemical liquid to the peripheral part; and
   regulating a temperature of the substrate to be a processing temperature in the removing after the heating and before the removing,
   wherein the heating changes copper hydroxide that is included in the copper film to copper oxide by heating the substrate,
   wherein the processing temperature is a temperature that is lower than a heating temperature for the substrate in the heating.

2. The substrate processing method according to claim 1, wherein the processing liquid contains hydrogen peroxide.

3. The substrate processing method according to claim 2, wherein the processing liquid is an SPM where sulfuric acid that is the acidic chemical liquid and hydrogen peroxide are mixed, an FPM where hydrofluoric acid that is the acidic chemical liquid and hydrogen peroxide are mixed, or an SC2 where hydrochloric acid that is the acidic chemical liquid and hydrogen peroxide are mixed.

* * * * *